(12) United States Patent
Lee et al.

(10) Patent No.: US 10,399,321 B2
(45) Date of Patent: Sep. 3, 2019

(54) APPARATUS FOR MANUFACTURING A DISPLAY DEVICE AND A METHOD USING THE SAME

(71) Applicant: SAMSUNG DISPLAY CO., LTD., Yongin-si, Gyeonggi-do (KR)

(72) Inventors: Soochan Lee, Yongin-si (KR); Hirokazu Ishii, Yongin-si (KR); Katsuhiko Tanaka, Yongin-si (KR)

(73) Assignee: SAMSUNG DISPLAY CO., LTD., Yongin-Si, Gyeonggi-Do (KR)

( * ) Notice: Subject to any disclaimer, the term of this patent is extended or adjusted under 35 U.S.C. 154(b) by 151 days.

(21) Appl. No.: 15/713,101

(22) Filed: Sep. 22, 2017

(65) Prior Publication Data
US 2018/0086043 A1    Mar. 29, 2018

(30) Foreign Application Priority Data
Sep. 23, 2016    (KR) .................... 10-2016-0122380

(51) Int. Cl.
*B32B 38/18*        (2006.01)
*B32B 3/04*         (2006.01)
(Continued)

(52) U.S. Cl.
CPC ............ *B32B 38/1866* (2013.01); *B32B 3/04* (2013.01); *B32B 3/28* (2013.01); *B32B 7/12* (2013.01);
(Continued)

(58) Field of Classification Search
CPC ............ B32B 38/1866; B32B 37/1009; B32B 37/0007; B32B 37/1018; B32B 37/003; B32B 37/1284; B32B 3/04; B32B 3/28; B32B 7/12; B32B 2457/20; G02F 1/1333; G06F 1/1601; H04M 1/0268
(Continued)

(56) References Cited

U.S. PATENT DOCUMENTS

2014/0002975 A1* 1/2014 Lee ................... H05K 5/0017
                                                361/679.01
2016/0105749 A1   4/2016 Qutub et al.

FOREIGN PATENT DOCUMENTS

| JP | 8-332646 | 12/1996 |
|----|----------|---------|
| JP | 10-175229 | 6/1998 |
| JP | 11-129272 | 5/1999 |
| JP | 2003-131211 | 5/2003 |

(Continued)

*Primary Examiner* — Nathanael R Briggs
*Assistant Examiner* — William D Peterson
(74) *Attorney, Agent, or Firm* — F. Chau & Associates, LLC (57) ABSTRACT

A method of manufacturing a display device includes disposing a curved cover window on a first jig, the first jig includes a settling unit having a curved portion and a supporting unit, the supporting unit includes a seesaw guide having a first portion and a second portion, a rotation axis disposed between the first and second portions, and a weight disposed on the first portion, wherein the seesaw guide is configured to rotate about the rotation axis, disposing a display panel on a second jig, rotating the first jig such that the cover window faces the display panel, and attaching the display panel to the cover window by raising or lowering the first jig or the second jig. The rotating of the first jig includes rotating the settling unit and the first jig such that the weight causes the second portion of the seesaw guide to contact the cover window.

20 Claims, 8 Drawing Sheets

(51) Int. Cl.
  *B32B 3/28*      (2006.01)
  *B32B 7/12*      (2006.01)
  *B32B 37/00*     (2006.01)
  *B32B 37/10*     (2006.01)
  *G02F 1/1333*    (2006.01)
  *G06F 1/16*      (2006.01)
  *H04M 1/02*      (2006.01)
  *B32B 37/12*     (2006.01)

(52) U.S. Cl.
  CPC ...... *B32B 37/0007* (2013.01); *B32B 37/1009* (2013.01); *B32B 37/1018* (2013.01); *G02F 1/1333* (2013.01); *G06F 1/1601* (2013.01); *H04M 1/0268* (2013.01); *B32B 37/003* (2013.01); *B32B 37/1284* (2013.01); *B32B 2457/20* (2013.01)

(58) Field of Classification Search
  USPC .......................................................... 349/58
  See application file for complete search history.

(56) References Cited

FOREIGN PATENT DOCUMENTS

| | | |
|---|---|---|
| JP | 3546333 | 4/2004 |
| JP | 2008-046302 | 2/2008 |
| JP | 2011-022403 | 2/2011 |
| JP | 2011-040182 | 2/2011 |
| JP | 5344870 | 8/2013 |
| JP | 5451432 | 1/2014 |
| JP | 2015-100941 | 6/2015 |
| KR | 10-0417081 | 1/2004 |
| KR | 2006-103177 | 4/2006 |
| KR | 20-2010-0008645 | 9/2010 |
| KR | 10-1006717 | 1/2011 |
| KR | 10-2011-0037652 | 4/2011 |
| KR | 10-2011-0065896 | 6/2011 |
| KR | 10-1325936 | 10/2013 |
| KR | 10-2014-0010919 | 1/2014 |
| KR | 10-2014-0047085 | 4/2014 |
| WO | WO 1996/039294 | 12/1996 |
| WO | WO 2012/176642 | 12/2012 |

\* cited by examiner

APPARATUS FOR MANUFACTURING A DISPLAY DEVICE AND A METHOD USING THE SAME

CROSS-REFERENCE TO RELATED APPLICATION

This application claims priority under 35 U.S.C. § 119 to Korean Patent Application No. 10-2016-0122380, filed on Sep. 23, 2016, in the Korean Intellectual Property Office, the disclosure of which is incorporated by reference herein in its entirety.

TECHNICAL FIELD

The present invention relates to a display device. More particularly, the present invention relates to an apparatus for manufacturing a display device and a method using the same.

DISCUSSION OF THE RELATED ART

Mobile electronic devices are widely used. A mobile electronic device generally includes a display unit to provide visual information such as still images or a video to users. Components used to drive the display unit are being made smaller, and at the same time, the size of the display unit is increasing. In addition, the display unit may be flexible.

SUMMARY

According to an exemplary embodiment of the present invention, a method of manufacturing a display device includes disposing a cover window on a first jig, wherein the cover window includes a curved portion, wherein the first jig includes a settling unit and a supporting unit, wherein the settling unit has a curved portion, and wherein a curvature of the curved portion of the cover window corresponds to a curvature of the curved portion of the settling unit, wherein the supporting unit includes a seesaw guide having a first portion and a second portion, a rotation axis disposed between the first and second portions of the seesaw guide, and a weight disposed on the first portion of the seesaw guide, wherein the seesaw guide is configured to rotate about the rotation axis, disposing a display panel on a second jig, rotating the first jig such that the cover window faces the display panel, and attaching the display panel to the cover window by raising or lowering at least one of the first jig or the second jig. The rotating of the first jig includes rotating the settling unit and the first jig such that the weight causes the second portion of the seesaw guide to contact the cover window.

According to an exemplary embodiment of the present invention, an apparatus for manufacturing a display device includes a first rotation axis, a first jig configured to rotates about the first rotation axis, the first jig including a settling unit and a supporting unit disposed at a side of the settling unit, wherein the settling unit is configured to receive a cover window, and the supporting unit is configured to rotate between a first position, when the first jig is disposed at a first position of the first jig, and a second position, when the first jig is disposed at a second position of the first jig, wherein, when the first jig is disposed in the first position of the first jig, the supporting unit permits access to the cover window, and when the first jig is disposed in the second position of the first jig, supporting unit fixes the cover window in place, and a second jig facing the settling unit when the first jig is in the second position of the first jig. The supporting unit includes a seesaw guide having a first portion and a second portion, a second rotation axis disposed between the first and second portions of the seesaw guide, and a weight disposed on the first portion of in the seesaw guide, wherein the seesaw guide is configured to rotate about the second rotation axis. When the first jig is in the second position of the first jig, the second portion of the seesaw guide presses on the settling unit, due to the weight, to fix the cover window on the settling unit.

According to an exemplary embodiment of the present invention, an apparatus for manufacturing a display device includes a first jig, a second jig, a first rotation axis connected to the first jig, and a rotation actuator configured to rotate the first jig, relative to the first rotation axis, between a first position and a second position, wherein the first jig includes a first supporting unit, a second supporting unit and a settling unit disposed between the first and second supporting units, wherein the settling unit has a curved portion and the settling unit is configured to receive a curved cover window thereon, wherein the first supporting unit includes a first seesaw guide, a second rotation axis, and a first weight, wherein the first seesaw guide has a first portion and a second portion, wherein the second rotation axis is disposed between the first and second portions of the first seesaw guide such that the first seesaw guide rotates about the second rotation axis, and the first weight is attached to the first portion of the first seesaw guide, wherein the second supporting unit includes a second seesaw guide, a third rotation axis, and a second weight, wherein the second seesaw guide has a first portion and a second portion, wherein the third rotation axis is disposed between the first and second portions of the second seesaw guide such that the second seesaw guide rotates about the third rotation axis, and the second weight is attached to the first portion of the first seesaw guide, wherein the second jig includes a housing and an elastic member disposed on the housing, wherein the elastic member is configured to receive a display panel thereon, wherein, when the first jig is in the first position, the first seesaw guide is in a first state and the first seesaw guide does not contact the settling unit, and the second seesaw guide is in a first state and the second seesaw guide does not contact the settling unit such that the curved cover window can be loaded onto the settling unit or such that the curved cover window is removable from the settling unit, and wherein, when the first jig is in the second position, the curved cover window faces the elastic member, the first seesaw guide is in a second state and contacts the curved cover window, and the second seesaw guide is in a second state and contacts the curved cover window such that the curved cover window is fixed relative to the settling unit.

BRIEF DESCRIPTION OF THE DRAWINGS

The above and other features of the present invention will become more apparent by describing in detail exemplary embodiments thereof in conjunction with the accompanying drawings, in which.

DETAILED DESCRIPTION OF THE EMBODIMENTS

Exemplary embodiments of the present invention will be described more fully hereinafter with reference to accompanying drawings. The present invention may, however, be embodied in different forms and should not be construed as limited to the embodiments set forth herein. Like reference numerals may refer to like elements throughout the specification, and any omitted descriptions may be assumed to be similar to that of corresponding elements. The sizes or proportions of elements illustrated in the drawings may be exaggerated for clarity.

A display device may include, for example, a liquid crystal display panel, an organic light-emitting display panel, or the like. Hereinafter, for convenience of explanation, a case in which the display device includes an organic light-emitting display panel will be described in detail.

Figure 1:
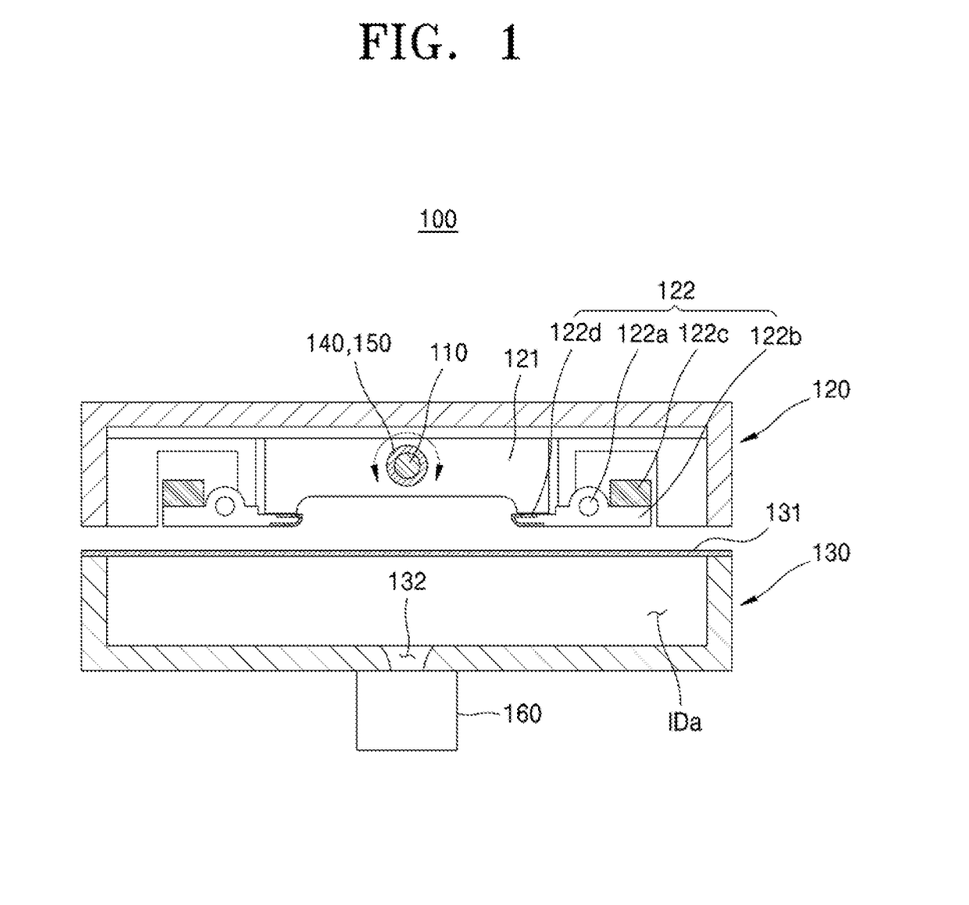
FIG. 1 is a diagram illustrating an apparatus for manufacturing a display device according to an exemplary embodiment of the present invention.

FIG. 1 is a diagram illustrating an apparatus for manufacturing a display device according to an exemplary embodiment of the present invention. FIGS. 2 to 7 are side views illustrating a method of operating the apparatus of FIG. 1, according to an exemplary embodiment of the present invention.

Referring to FIG. 1, an apparatus 100 can be used to manufacture a display device (e.g., the display device may be a display panel P that is attached to a curved window W). The apparatus 100 may include a jig rotation axis 110, a first jig 120 and a second jig 130.

The jig rotation axis 110 may be located in the first jig 120. For example, the jig rotation axis 110 may be set at a center (e.g., center of mass, center of area, midpoint along a horizontal plane, midpoint along a vertical plane, etc.) of the first jig 120. However, the present invention is not limited thereto, and the jig rotation axis 110 may be disposed at any location of the first jig 120. Regarding the rotation of the first jig 120, the jig rotation axis 110 partially supports the first jig 120, and when the jig rotation axis 110 is set at a location off from the center of the first jig 120, the jig rotation axis 110 may be more susceptible to fatigue deformation due to the weight of the first jig 120. Therefore, the jig rotation axis 110 may be set at the center of the first jig 120 or sufficiently close to the center of the first jig 120 to experience low or negligible fatigue deformation. As described hereinafter, the jig rotation axis 110 also may be set at an end portion of the first jig 120, as described below with reference to FIGS. 8 and 9.

A rotation actuator 140, which provides a driving force to rotate the jig rotation axis 110 (e.g., to rotate the first jig 120), and an elevation actuator 150, which provides a driving force to raise or lower the first jig 120, may be disposed on the jig rotation axis 110. For convenience of explanation, FIG. 1 illustrates that both the rotation actuator 140 and the elevation actuator 150 are disposed at the jig rotation axis 110. However, the present invention is not limited thereto. For example, the rotation actuator 140 provides a driving force to rotate the jig rotation axis 110, and the rotation actuator 140 can be disposed at any location of the first jig 120 such that the rotation actuator 140 can rotate the first jig 120. In addition, when providing a driving force to raise or lower the first jig 120, the elevation actuator 150 may be set at any location of the first jig 120 to raise or lower the first jig 120. The rotation actuator 140 and the elevation actuator 150 are connected to the jig rotation axis 110 and provide a driving force to rotate and raise or lower the jig rotation axis 110. In addition, the rotation actuator 140 and the elevation actuator 150 may be disposed in different areas of the first jig 110 to rotate and raise or lower the first jig 110.

For example, the rotation actuator 140 and the elevation actuator 150 may include various devices. For example, the rotation actuator 140 and the elevation actuator 150 may be cylinders rotating, or raising or lowering the first jig 120 by pneumatic pressure or hydraulic pressure, or may include a motor which operates by electric energy.

Figure 2:
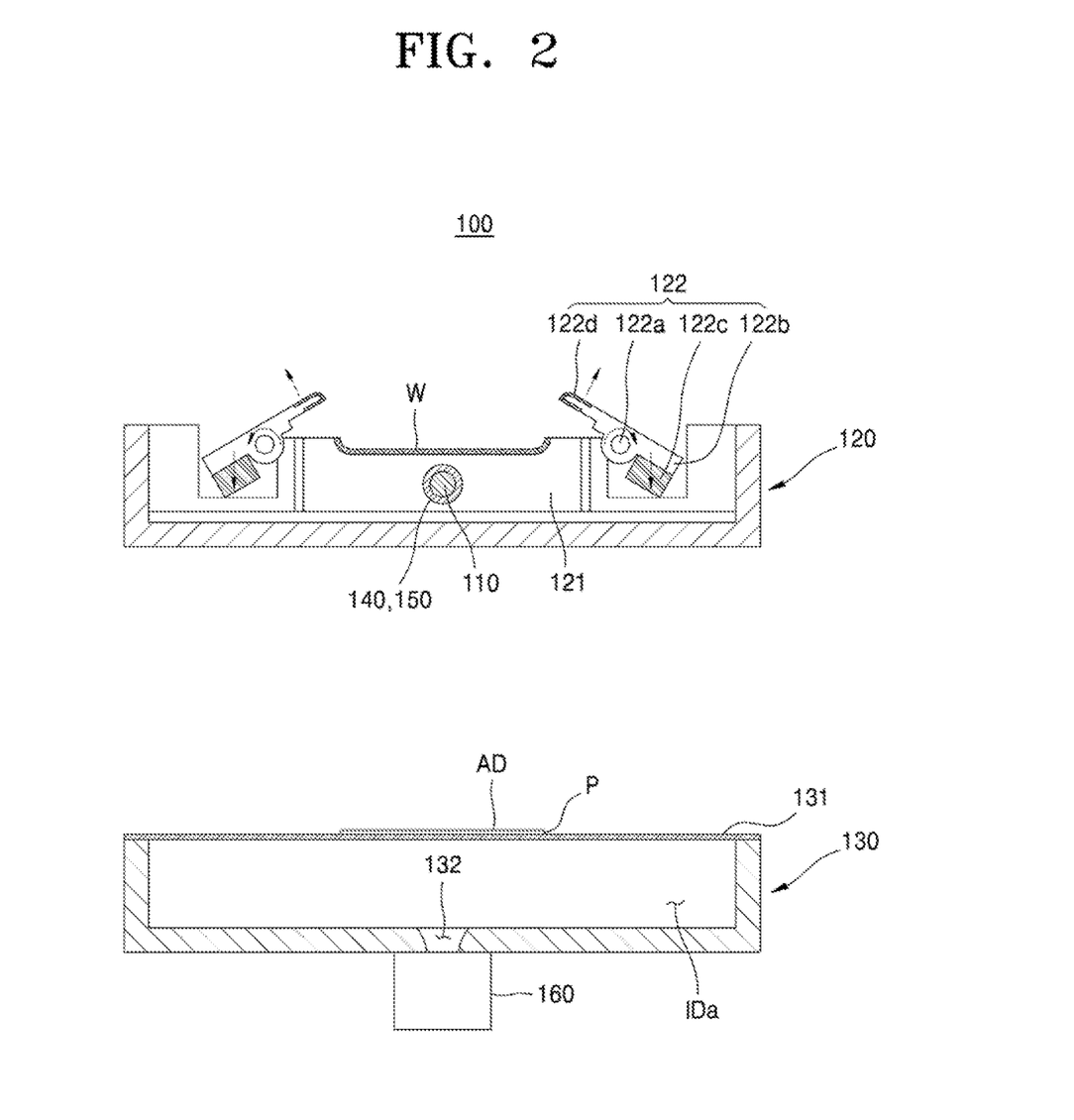
FIGS. 2 to 7 are side views illustrating a method of operating the apparatus of FIG. 1, according to an exemplary embodiment of the present invention.
Figure 3:
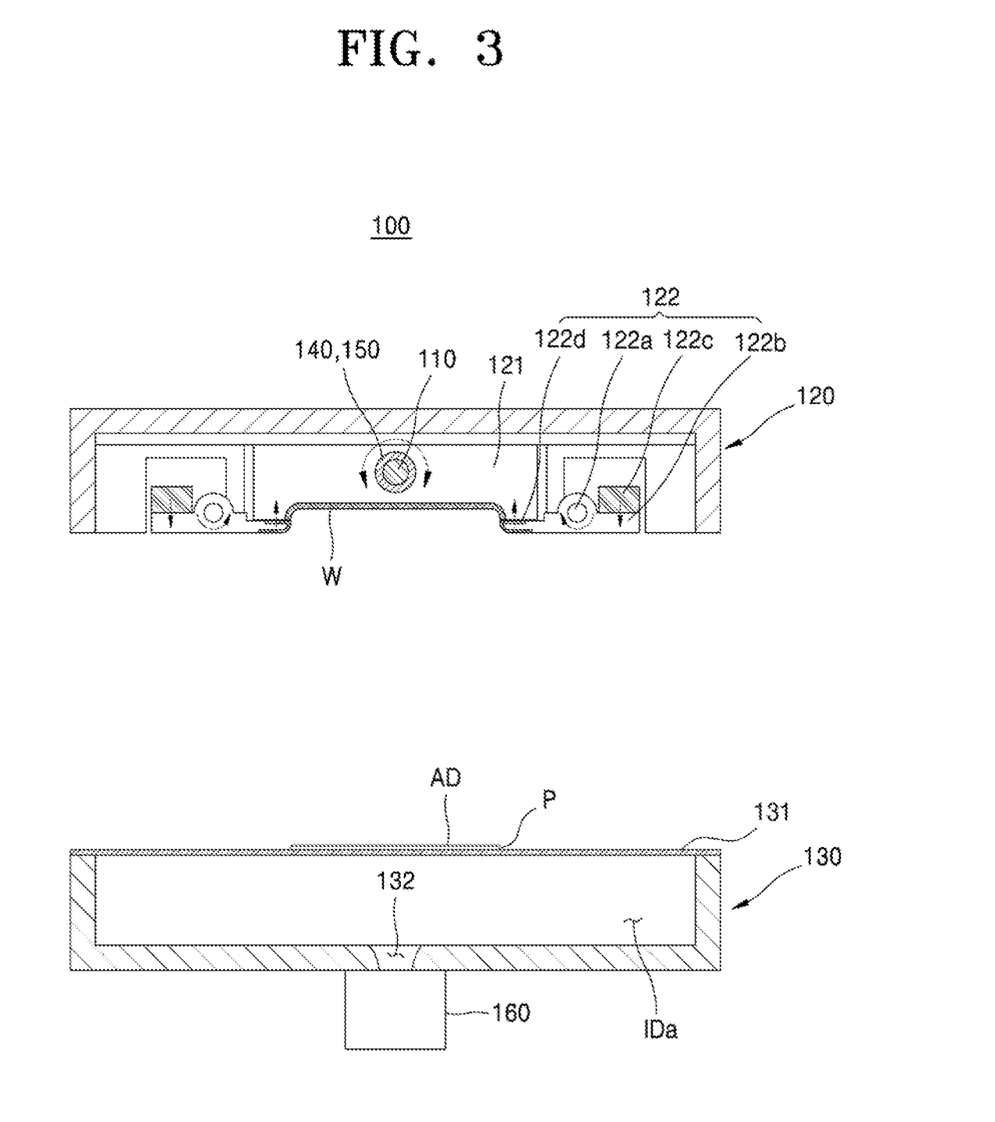

The first jig 120 includes a settling unit 121 on which the cover window W is disposed and a supporting unit 122 which may rotate between a first position (as may be seen in FIG. 2) and a second position (as may be seen in FIG. 3). The cover window W may be, for example, a protective cover. In the first position, the supporting unit 122 may partially overlap with a portion of the settling unit 121 or may be disposed in a vicinity of the settling unit 121. In addition, the disposal of the supporting unit 122 in the first position permits access to the cover window W. In the second position, the supporting unit 122 may fix the cover window W. In addition, the first jig 120 may be rotatable in a clockwise direction or a counterclockwise direction, having the jig rotation axis 110 as the center of the first jig 120.

The settling unit 121 and the cover window W may have a similar shape, and at least a part of the surface of the settling unit 121 adjacent to the cover window W may be curved. For example, when the first jig 120 is in the second position (as may be seen in FIG. 3), at least a part of the settling unit 121 may be inserted in a direction away from the second jig 130, with respect to the first jig 120. Accordingly, the cover window W may be protected from deformation or damage in a process to be described below, in which the display panel P is attached to the cover window W. The display panel P may be, for example, a liquid crystal display panel, an organic light emitting display panel, etc.

The supporting unit 122 may include a seesaw rotation axis 122a, a seesaw guide 122b which may rotate with the seesaw rotation axis 122a as a center, and a mass 122c which is attached to a portion of the seesaw guide 122b to apply weight to the seesaw guide 122b. The term "weight", as used in this specification, may be used to represent an object used to apply downward force. For example, the mass 122c may apply sufficient weight to a side of the supporting unit 122 such that the supporting unit 122 may rotate along with the first jig 120, as illustrated in FIGS. 2 and 3. Thus, the supporting unit 122 may be pressed against the settling unit 121.

In the case of FIG. 2, "sufficient weight" may refer to the weight of the mass 122c that is needed for the supporting unit 122 on the left to rotate in the counterclockwise direction with the seesaw rotation axis 122a as the center, and for the supporting unit 122 on the right to rotate in the clockwise direction with the seesaw rotation axis 122a as the center. In the case of FIG. 3, "sufficient weight" may refer to the weight of mass 122c that is needed for the supporting unit 122 to press against the settling unit 121. For example, the mass 122c may have sufficient weight to overcome static friction force between the seesaw rotation axis 122a and the seesaw guide 122b.

The apparatus for manufacturing the display device 100, according to an exemplary embodiment of the present invention, is described to have two supporting units 122 disposed on the left and the right sides of the first jig 120, respectively. However, the present invention is not limited thereto. In an exemplary embodiment of the present invention, only one the supporting unit 122 may be used, and the supporting unit 121 may be disposed on the left or right side of the first jig 120. When only one the supporting unit 122 is used, a fixing unit may be disposed in a side of the first jig 120 in which the supporting unit 122 is not disposed. The fixing unit may have a substantially identical shape as the supporting unit 122. In addition, in case the cover window W is disposed on the settling unit 121 and is opposite to the display panel P, as illustrated in FIG. 3, the fixing unit may fix the cover window W such that the cover window W might not descend (e.g., fall down). However, for convenience of explanation, a case in which two supporting units 122 are respectively disposed on the left and the right sides of the first jig 120 will be described hereinafter.

The rotation actuator 140, which is connected to and disposed on the jig rotation axis 110, might not be disposed on the seesaw rotation axis 122a. For example, the seesaw rotation axis 122a functions only as the center of rotation for the seesaw guide 122b, and might not provide a driving force to rotate the seesaw guide 122b. The seesaw guide 122b may rotate along with a reciprocating motion of the first jig 120 between the first position (as may be seen in FIG. 2) and the second position (as may be seen in FIG. 3) without an additional actuator. For example, the portion of the seesaw guide 122b, which is opposite to the portion on which the mass 122c is disposed, may move in a direction opposite to the direction in which the mass 122c moves.

When the first jig 120 is in the first position (as may be seen in FIG. 2), as the portion of the seesaw guide 122b on which the mass 122c is disposed moves downward, the other portion of the seesaw guide 122b may move upward, with respect to the seesaw rotation axis 122a. In this case, the other portion of the seesaw guide 122b may expose the cover window W on the settling unit 121. When the first jig 120 is in the second position (as may be seen in FIG. 3), as the portion of the seesaw guide 122b on which the mass 122c is disposed moves downward, the other portion of the seesaw guide 122b may move upward with respect to the seesaw rotation axis 122a, and touch the settling unit 121.

For example, when the first jig 120 is in the second position (as may be seen in FIG. 3), an end of the supporting unit 122 opposite to the seesaw guide 122b may prevent the cover window W from descending by touching opposite ends of the settling unit 121 and by touching opposite ends of the cover window W.

The supporting unit 122 may further include a non-adhesive coating unit 122d (e.g., a non-adhesive coat) which is disposed on the end (e.g., or portion) of the supporting unit 122 opposite to the seesaw guide 122b. The non-adhesive coating unit 122d may directly contact the cover window W, as illustrated in FIG. 3. Accordingly, alien substances or a pollutants may be prevented from permeating the cover window W.

The second jig 130 includes an elastic membrane 131, which may enclose an inner portion Ida of the second jig 130. The display panel P may be disposed on the elastic membrane 131. When the first jig 120 is in the second position (as may be seen in FIG. 3), the second jig 130 may be disposed opposite to the settling unit 121. An actuator, similar to the elevation actuator 150, may also be disposed in the second jig 130. For example, even though it is illustrated that the first jig 120 may be raised or lowered relative to the second jig 130, the present invention is not limited thereto. The second jig 130 also may be connected to an additional actuator and may be raised or lowered relative to the first jig 120. For convenience of explanation, a case in which the elevation actuator 150 is disposed only in the first jig 120 may be described below.

The second jig 130 may further include a first hole 132, which connects an inner portion IDa of the second jig 130 to an outer portion of the second jig 130. In addition, a first pump 160 may be disposed in the first hole 132 to absorbs air from or to inject air into the inner portion IDa of the second jig 130. For example, the first pump 160 may be a vacuum pump which may create a vacuum in the inner portion IDa of the second jig 130.

The first jig 120 also may include a second hole which connects an inner portion of the first jig 120 to an outer portion of the first jig 120. In addition, in the second hole, a second pump which absorbs air from or injects air into the inner portion IDb (as may be seen in FIG. 4) of the first jig 120. The second pump also may be a vacuum pump which may apply vacuum pressure to the inner portion IDb of the first jig 120.

In an apparatus 100 for manufacturing a display device, according to an exemplary embodiment of the present invention, the cover window W may be fixed to the display panel P once the display panel P is disposed on the cover window W, and an adhesion layer AD, which is attached to the display panel P, may be accurately disposed on the cover window W. Therefore, a display device having a curved shape may be produced. In addition, a manufacturing defect rate may be decreased.

FIGS. 2 to 7 are side views illustrating a method of operating the apparatus of FIG. 1, according to an exemplary embodiment of the present invention.

The cover window W may be processed to be used in a display device. The cover window W may include various materials, for example, glass or plastic. However, the cover window W is not limited to these materials, and may include any material which may be used to form the cover window W with a curved shape. The cover window W may have two opposite curved ends, but the present invention is not limited thereto. For example, the entire cover window W may be curved, and the cover window W may have a surface having an arc shape or a circular shape. However, for convenience of explanation, a case in which the two opposite ends of the cover window W are curved will be described below.

When the cover window W has been manufactured to have a curved shape, the display panel P may be manufactured. The display panel P may be a touch screen panel (TSP) or a non-TSP.

When the cover window W and the display panel P are prepared, the adhesion layer AD may be applied to a side of the display panel P. For example, the adhesion layer AD may be formed into a film and disposed to the display panel P, or may be applied to the display panel P in the form of viscous fluid. Hereinafter, for convenience of explanation, a case in which the adhesion layer AD is provided as a film will be described.

FIG. 2 illustrates a case in which the supporting unit 122 of the first jig 120 is located in the first position, which permits access to the cover window W.

Referring to FIG. 2, after disposing the adhesion layer AD on the display panel P, the cover window W and the panel member P may be disposed respectively on the first jig 120 and the second jig 130. For example, the cover window W, having a shape corresponding to the shape of the settling unit 121, may be disposed on the first jig 120. The first jig 120 includes the settling unit 121 having at least a curved portion. The display panel P is disposed on the elastic membrane 131 of the second jig 130. In addition, the adhesion layer AD may be applied to the display panel P before disposing the display panel P on the elastic membrane 131.

The portion of the seesaw guide 122b on which the mass 122c is allocated may descend by the weight of the mass 122c. Accordingly, the portion of the seesaw guide 122b, which is opposite to the portion on which the mass 122c is disposed, may ascend with respect to the seesaw rotation axis 122a. In addition, when the portion of the seesaw guide 122b, which is opposite to the portion on which the mass 122c is disposed, moves in a direction opposite to the direction in which the mass 122c moves, for example, when the other portion of the seesaw guide 122b ascends, the seesaw guide 122b opens the settling unit 121. Thus, a passage is formed, through which the cover window W may be disposed on the settling unit 121.

FIG. 3 illustrates the settling unit 122 of the first jig 120 in the second position, and illustrates the rotation of the first jig 120 in FIG. 2 by 180 degrees with respect to the first jig 120 shown in FIG. 2. In this case, the first jig 120 is rotated around the jig rotation axis 110. By this operation of the first jig 120, the cover window W, disposed on the first jig 120, and the display panel P, disposed on the second jig 130, may be disposed opposite to each other and may face each other. After allocating the cover window W and the display panel P opposite to each other, the cover window W and the display panel P may be aligned by moving at least one of the first jig 120 and the second jig 130. For example, at least one of the first jig 120 and the second jig 130 may be moved in a horizontal direction in FIG. 3 to accurately align the cover window W with the display panel P in a vertical direction.

Referring to FIG. 3, the portion of the seesaw guide 122b on which the mass 122c is allocated may descend by the weight of the mass 122c. Accordingly, the portion of the seesaw guide 122b, which is opposite to the portion on which the mass 122c is disposed, may ascend. Likewise, the portion of the seesaw guide 122b, which is opposite to the portion on which the mass 122c is disposed, moves in a direction opposite to a direction in which the mass 122c moves, the portion of the seesaw guide 122b, which is opposite to the portion on which the mass 122c is disposed, may touch the settling unit 121 and the cover window W. Thus, the portion of the seesaw guide 122b, which is opposite to the portion on which the mass 122c is disposed, may fix the cover window W to the settling unit 121. Thus, the cover window W may be prevented from descending.

As described above, the cover window W may be easily fixed without connecting an additional actuator to rotate the supporting unit 122 around the seesaw rotation axis 122a. Accordingly, a loading operation of the apparatus 100 may be reduced.

Figure 4:
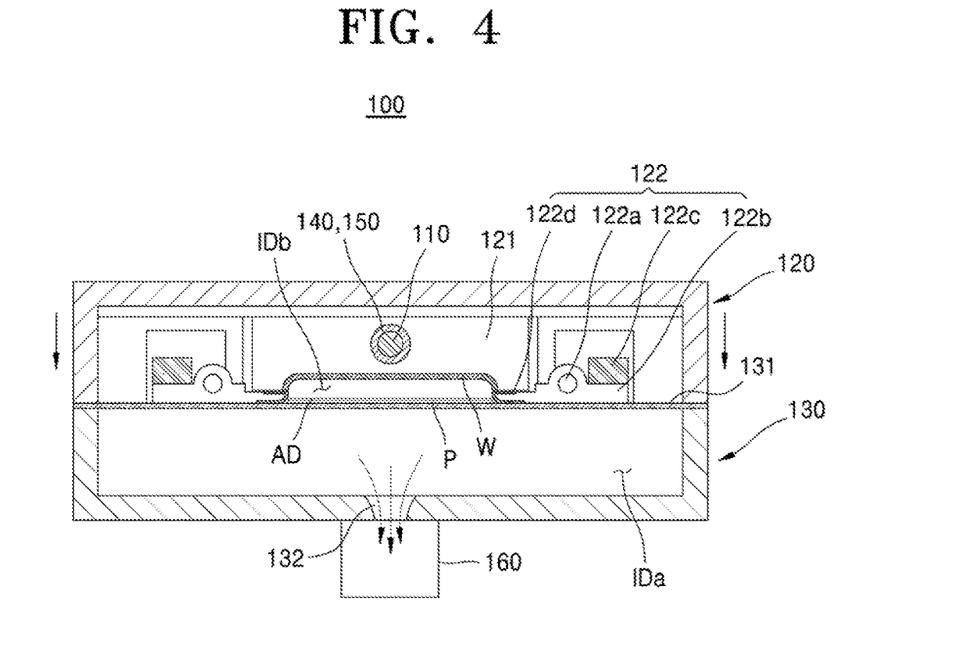

FIG. 4 illustrates the first jig 120 having descended toward the second jig 130 and being combined with the second jig 130. Thus, the inner portions of the first jig 120 and the second jig 130 may be enclosed. Also, FIG. 4 illustrates the suction of air from the inner portion IDa of the second jig 130 by operating the first pump 160. The second jig 130 which is enclosed by the elastic membrane.

Herein, FIG. 4 illustrates that the first jig 120 descends toward the second jig 130. However, this is merely exemplary, and the present invention is not limited thereto. For example, the second jig 130 may ascend toward the first jig 120, or the first jig 120 and the second jig 130 may both move toward each other at the same time to be combined with each other.

A second hole, which connects the inner portion IDb and the outer portion of the first jig 120, may be formed in the first jig 120. In addition, to the second hole, a second pump, which absorbs air from or injects air into the inner portion IDb of the first jig 120, may be connected to the second hole. The drawings illustrates that the first pump 160 is connected to the second jig 130 to suction air from the inner portion IDa of the second jig 130 through the first hole 132 to reduce the pressure in the inner portion IDa of the second jig 130 to vacuum pressure. However, this is merely exemplary, and the second pump may also be used to reduce the pressure in the inner portion IDb of the first jig 120 into vacuum pressure. Thus, air bubbles or foreign substances may be prevented from occurring or being disposed between the cover window W and the display panel P in the process of attaching the display panel P to the cover window W.

Figure 5:
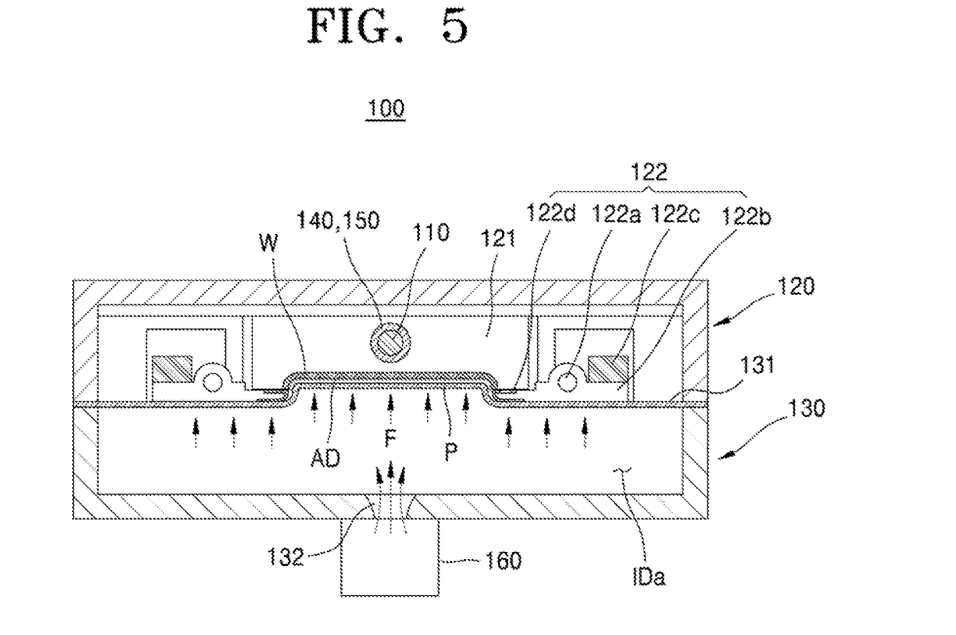

FIG. 5 illustrates the display panel P being attached to the cover window W by increasing the pressure in the inner portion IDa of the second jig 130. As illustrated, the first pump 160 may inject air into the inner portion IDa of the second jig 130 through the first hole 132. Accordingly, the elastic membrane 131 may expand toward the first jig 120. As the elastic membrane 131 expands toward the first jig 120, the display panel P, disposed on the elastic membrane 131, may approach the cover window W and may be attached to a surface of the cover window W.

The display panel P may be laid flat on the elastic membrane 131. However, regardless of the shape (e.g., flat) of the display panel P before being attached to the cover window W, a part of the display panel P may be curved when attached to the cover window W to conform to the shape of the cover window W.

Figure 6:
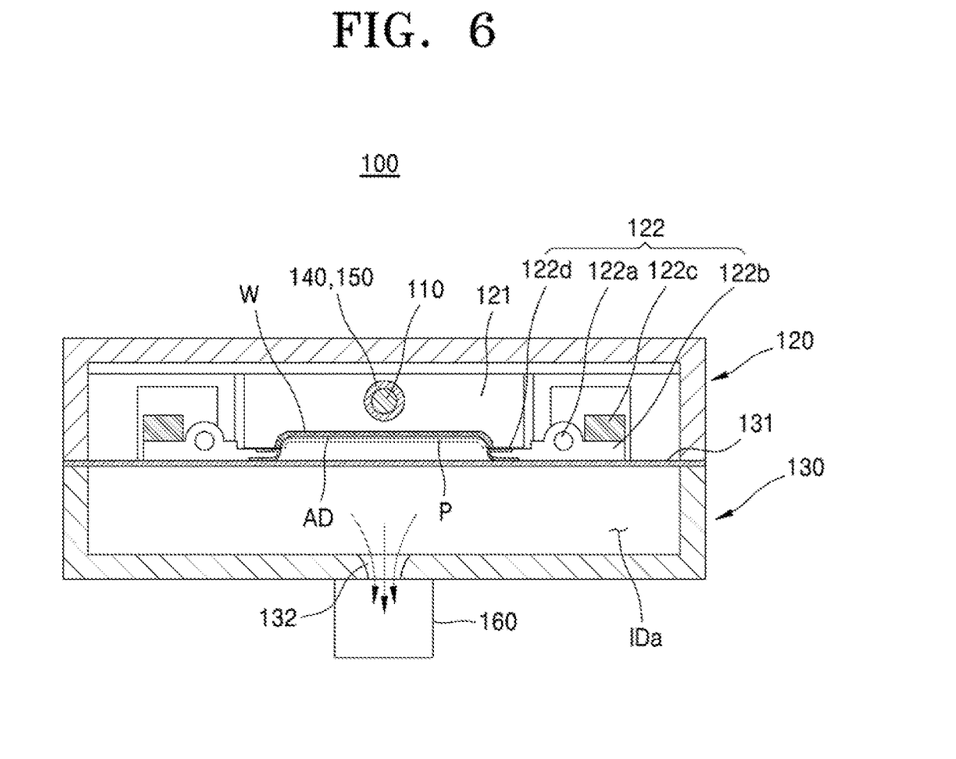

FIG. 6 illustrates the suctioning of air included in the inner portion IDa of the second jig 130 after the display panel P is attached to the cover window W. Here, the first pump 160 may absorb the air remaining in the inner portion IDa of the second jig 130 through the first hole 132. When the air in the inner portion IDa of the second jig 130 is removed from the inner portion IDa, the elastic membrane 131 may shrink again and may be restored to its original shape.

Figure 7:
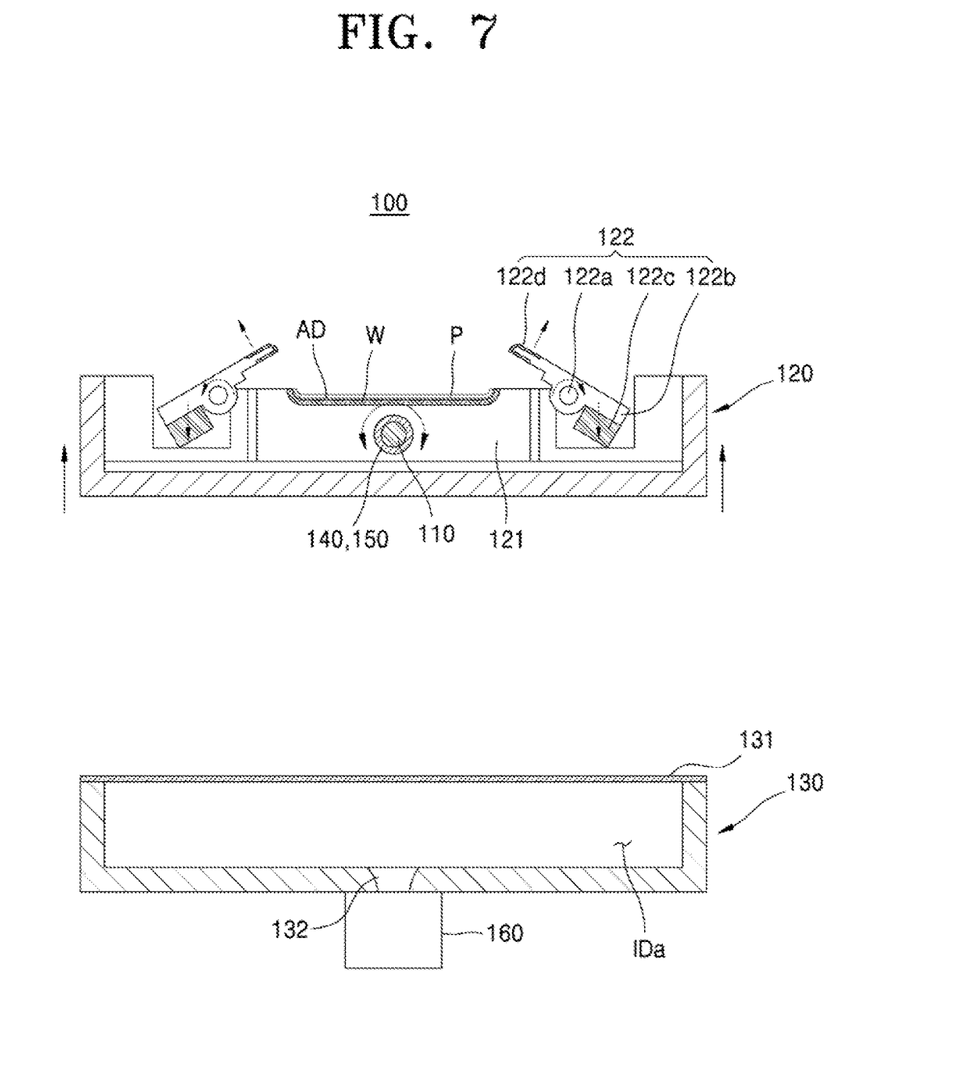

FIG. 7 illustrates an image in which the elastic membrane 131 is restored into its original shape, the first jig 120 is moved upward, and the settling unit 121 is opened (e.g., exposed) by rotating the first jig 120. Thus, the settling unit 121 may be opened or closed by rotating the first jig 120. When the first jig 120 is rotated, the weights disposed on the supporting unit 122 cause the supporting unit 122 to open (e.g., expose) the settling unit 121, as shown in FIG. 7, or close (e.g., press against the settling unit 121), as shown in FIG. 3. Then, the display panel P and the cover window W, attached together, may be removed from the first jig 120.

Figure 8:
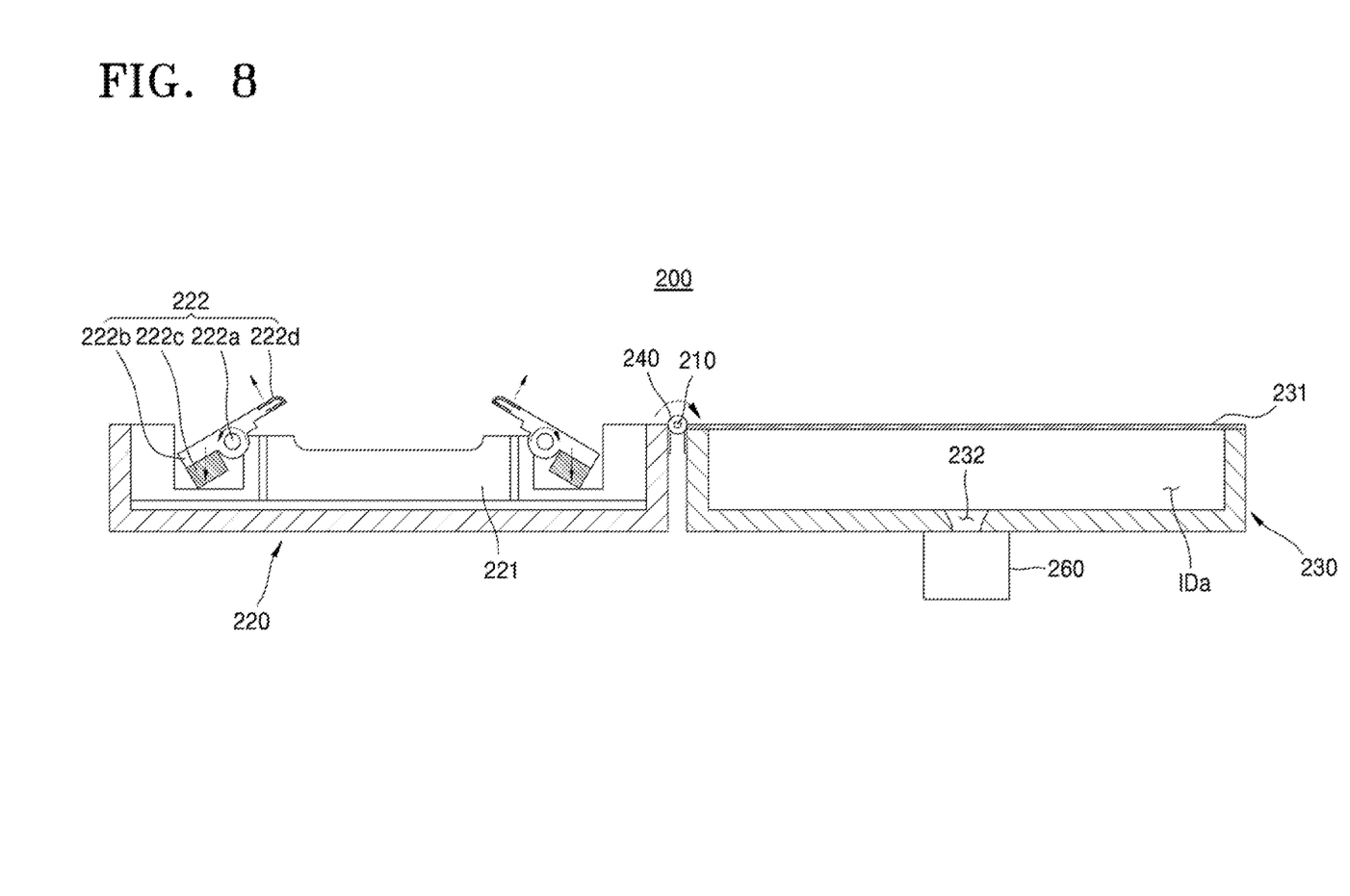
FIG. 8 is a diagram illustrating an apparatus for manufacturing a display device according to an exemplary embodiment of the present invention.
Figure 9:
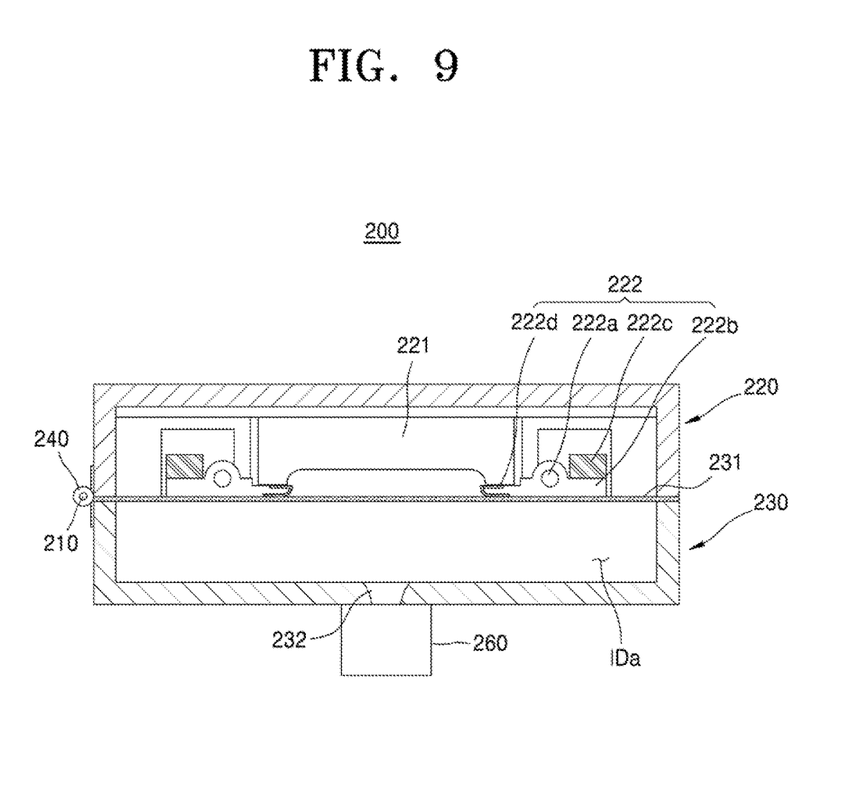
FIG. 9 is drawing side view illustrating an operating state of the apparatus of FIG. 8, according to an exemplary embodiment of the present invention.

FIG. 8 is a diagram illustrating an apparatus 200 for manufacturing a display device according to an exemplary embodiment of the present invention. FIG. 9 is drawing side view illustrating an operating state of the apparatus of FIG. 8, according to an exemplary embodiment of the present invention.

Referring to FIGS. 8 and 9, as described above, the jig rotation axis 210 may be disposed at an end portion of the first jig 220 and the second jig 230. The first jig 220 and the second jig 230 may be combined (e.g., coupled) by a hinge formed at the jig rotation axis 210.

FIG. 8 illustrates an image in which the first jig 220 is in the first position, in which the supporting unit 222 of the first jig 220 permits access to the cover window (refer W in FIG. 2). FIG. 9 illustrates the first jig 220 in the second position, in which the supporting unit 222 of the first jig 220 may fix the cover window W (e.g., press against the cover window W). Referring to FIG. 8 and FIG. 9, the rotation actuator 240 on the seesaw rotation axis 210 operates and rotates the first jig 220 in the clockwise direction, to move the first jig 220 from the first position to the second position.

By using the apparatuses 100 and/or 200, and by using the method described above to form a curved display device, a manufacturing error rate may be decreased and the curved display device may be manufactured rapidly. In addition, the method of manufacturing the curved display, as described above, may reduce costs and increase throughput of the apparatuses 100 or 200.

While the present invention has been particularly shown and described with reference to exemplary embodiments thereof, it will be apparent to those of ordinary skill in the art that various changes in form and detail may be made therein without departing from the spirit and scope of the present invention as defined by the following claims.

What is claimed is:

1. A method of manufacturing a display device, comprising:
    disposing a cover window on a first jig, wherein the cover window includes a curved portion,
    wherein the first jig includes a settling unit and a supporting unit, wherein the settling unit has a curved portion, and wherein a curvature of the curved portion of the cover window corresponds to a curvature of the curved portion of the settling unit,
    wherein the supporting unit includes a seesaw guide having a first portion and a second portion, a rotation axis disposed between the first and second portions of the seesaw guide, and a weight disposed on the first portion of the seesaw guide, wherein the seesaw guide is configured to rotate about the rotation axis;
    disposing a display panel on a second jig;
    rotating the first jig such that the cover window faces the display panel; and
    attaching the display panel to the cover window by raising or lowering at least one of the first jig or the second jig,
    wherein the rotating of the first jig comprises:
    rotating the settling unit and the first jig such that the weight causes the second portion of the seesaw guide to contact the cover window.

2. The method of claim 1, wherein the disposing of the display panel on the second jig comprises applying an adhesive layer to the display panel.

3. The method of claim 1, further comprising:
    aligning the cover window with the display panel by moving at least one of the first jig or the second jig after the rotating of the first jig.

4. The method of claim 1, wherein the attaching of the display panel to the cover window comprises enclosing an inner space of the first jig and the second jig by combining the first jig with the second jig.

5. The method of claim 4, wherein the attaching of the display panel to the cover window further comprises reducing a pressure in the inner space between the first jig and the second jig to approximately vacuum pressure after enclosing the inner space of the first jig and the second jig.

6. The method of claim 5, wherein the attaching of the display panel to the cover window further comprises moving the display panel toward the cover window by increasing an air pressure in an inner portion of the second jig to expand an elastic membrane included in the second jig after reducing the pressure in the inner space between the first jig and the second jig.

7. The method of claim 6, wherein, the display panel is disposed substantially flat on the elastic membrane, and wherein at least a portion of the display panel is curved and is attached to the cover window when moving of the display panel toward the cover window.

8. An apparatus for manufacturing a display device, the apparatus comprising:
    a first rotation axis;
    a first jig configured to rotates about the first rotation axis, the first jig comprising a settling unit and a supporting unit disposed at a side of the settling unit,
    wherein the settling unit is configured to receive a cover window, and the supporting unit is configured to rotate between a first position, when the first jig is disposed at a first position of the first jig, and a second position, when the first jig is disposed at a second position of the first jig,
    wherein, when the first jig is disposed in the first position of the first jig, the supporting unit permits access to the cover window, and when the first jig is disposed in the second position of the first jig, supporting unit fixes the cover window in place; and
    a second jig facing the settling unit when the first jig is in the second position of the first jig,
    wherein the supporting unit comprises:
    a seesaw guide having a first portion and a second portion;
    a second rotation axis disposed between the first and second portions of the seesaw guide; and
    a weight disposed on the first portion of in the seesaw guide, wherein the seesaw guide is configured to rotate about the second rotation axis,
    wherein, when the first jig is in the second position of the first jig, the second portion of the seesaw guide presses on the settling unit, due to the weight, to fix the cover window on the settling unit.

9. The apparatus of claim 8, wherein the first rotation axis is disposed in the first jig.

10. The apparatus of claim 8, wherein the first rotation axis is connected to an end of the first jig and to an end of the second jig such that the first and second jigs are hinged with respect to the first rotation axis.

11. The apparatus of claim 8, further comprising:
    a rotation actuator which provides a driving force to rotate the first rotation axis.

12. The apparatus of claim 8, further comprising:
    an elevation actuator which provides a driving force to raise or lower at least one of the first jig or the second jig.

13. The apparatus of claim 8, wherein the supporting unit further comprises a non-adhesive coat disposed on the second portion of the seesaw guide.

14. The apparatus of claim 8, wherein the second jig comprises an elastic membrane,
    wherein the elastic membrane encloses an inner portion of the second jig and supports a display panel.

15. The apparatus of claim 8, wherein the second jig comprises a first hole, the first hole connecting an inner portion of the second jig and an outer portion of the second jig.

16. The apparatus of claim 15, further comprising:
    a first pump which is connected to the first hole to remove air from or to inject air into the inner portion of the second jig.

17. The apparatus of claim 8, wherein the first jig further comprises a second hole, the second hole connecting an inner portion of the first jig to an outer portion of the first jig.

18. The apparatus of claim 17, further comprising:
a second pump which is connected to the second hole to remove air from or to inject air into the inner portion of the first jig.

19. The apparatus of claim 8, wherein, a portion of the settling unit, which is configured to receive the cover window, is concave.

20. An apparatus for manufacturing a display device, the apparatus comprising:
a first jig;
a second jig;
a first rotation axis connected to the first jig; and
a rotation actuator configured to rotate the first jig, relative to the first rotation axis, between a first position and a second position,
wherein the first jig includes a first supporting unit, a second supporting unit and a settling unit disposed between the first and second supporting units, wherein the settling unit has a curved portion and the settling unit is configured to receive a curved cover window thereon,
wherein the first supporting unit includes a first seesaw guide, a second rotation axis, and a first weight, wherein the first seesaw guide has a first portion and a second portion, wherein the second rotation axis is disposed between the first and second portions of the first seesaw guide such that the first seesaw guide rotates about the second rotation axis, and the first weight is attached to the first portion of the first seesaw guide,
wherein the second supporting unit includes a second seesaw guide, a third rotation axis, and a second weight, wherein the second seesaw guide has a first portion and a second portion, wherein the third rotation axis is disposed between the first and second portions of the second seesaw guide such that the second seesaw guide rotates about the third rotation axis, and the second weight is attached to the first portion of the first seesaw guide,
wherein the second jig includes a housing and an elastic member disposed on the housing, wherein the elastic member is configured to receive a display panel thereon,
wherein, when the first jig is in the first position, the first seesaw guide is in a first state and the first seesaw guide does not contact the settling unit, and the second seesaw guide is in a first state and the second seesaw guide does not contact the settling unit such that the curved cover window can be loaded onto the settling unit or such that the curved cover window is removable from the settling unit, and
wherein, when the first jig is in the second position, the curved cover window faces the elastic member, the first seesaw guide is in a second state and contacts the curved cover window, and the second seesaw guide is in a second state and contacts the curved cover window such that the curved cover window is fixed relative to the settling unit.

* * * * *